United States Patent [19]

Sasashita et al.

[11] Patent Number: 5,916,732
[45] Date of Patent: *Jun. 29, 1999

[54] PHOTOSENSITIVE RESIN COMPOSITIONS FOR PRINTING PLATES AND PHOTOSENSITIVE RESIN PLATE MATERIALS

[75] Inventors: Katsutoshi Sasashita; Shinji Tanaka; Shigetora Kashio, all of Aichi, Japan

[73] Assignee: Toray Industries, inc., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/553,450
[22] PCT Filed: Apr. 13, 1995
[86] PCT No.: PCT/JP95/00719
§ 371 Date: Jan. 24, 1996
§ 102(e) Date: Jan. 24, 1996
[87] PCT Pub. No.: WO95/28665
PCT Pub. Date: Oct. 26, 1995

[30] Foreign Application Priority Data

Apr. 13, 1994 [JP] Japan .................................. 6-074882
Apr. 13, 1994 [JP] Japan .................................. 6-074883

[51] Int. Cl.$^6$ .......................... G03F 7/033; G03F 7/038; G03F 7/037
[52] U.S. Cl. .................. 430/287.1; 430/306; 430/300; 430/281.1; 430/288.1; 430/286.1; 430/906; 430/911
[58] Field of Search .................................. 430/306, 300, 430/287.1, 286.1, 281.1, 288.1

[56] References Cited

U.S. PATENT DOCUMENTS

| | | | |
|---|---|---|---|
| 4,272,608 | 6/1981 | Proskow | 430/286.1 |
| 4,517,279 | 5/1985 | Worns | 430/286.1 |
| 5,147,757 | 9/1992 | Kurtz et al. | 430/286.1 |
| 5,362,604 | 11/1994 | Yatsuyanagi | 430/306 |

FOREIGN PATENT DOCUMENTS

| | | | |
|---|---|---|---|
| 273393 | 7/1988 | European Pat. Off. | 430/286 |
| 513493 | 11/1992 | European Pat. Off. | 430/306 |
| 62-70835 | 4/1987 | Japan . | |
| 62-165643 | 7/1987 | Japan . | |
| 63-74065 | 4/1988 | Japan . | |
| 5-181272 | 7/1993 | Japan . | |
| 5-216224 | 8/1993 | Japan . | |

OTHER PUBLICATIONS

93–267217 [34] WPIDS—English Abstract of JP 5–181272, Toray IND INC–from WPIDS File of Derwent Information LTD.
*Encyclopedia of Polymer Science and Engineering* vol. 17, pp. 666–698, under "Vulcanization", John Wiley & Sons, Inc, 1989.
Rubber Chemistry and Technology, vol. 55, 116–117 (1982).

*Primary Examiner*—Cynthia Hamilton
*Attorney, Agent, or Firm*—Austin R. Miller

[57] ABSTRACT

A photosensitive resin composition for printing plates including the following components A, B-1, C and D, or a photosensitive resin composition for printing plates, including the following components A, B-2, C and D:

A: a hydrophilic polymer
B-1: a rubber having a molecular weight of 40,000 or more
B-2: a dynamically-vulcanized rubber
C: a photo-polymerizing unsaturated compound having ethylenic double bond(s) in the molecule
D: a photo-polymerization initiator.

The photosensitive resin compositions for printing plates of the invention have high-degree image reproducibility and flexibility suitable for flexography and additionally have good water developability with satisfactory compatibility with aqueous ink. Therefore, using the compositions, flexographic printing plates with excellent printing durability in flexography using aqueous ink or other flexographic printing inks can be produced. Further, using these, water-developable plates for flexography with good rubber elasticity can be produced.

17 Claims, No Drawings

PHOTOSENSITIVE RESIN COMPOSITIONS FOR PRINTING PLATES AND PHOTOSENSITIVE RESIN PLATE MATERIALS

TECHNICAL FIELD

The present invention relates to photosensitive resin compositions for printing plates and, more precisely, to photosensitive resin compositions for printing plates which are developable with water to give printing plates with improved printing durability suitable for flexography.

BACKGROUND ART

A photosensitive resin composition comprising, as a carrier resin component, an elastomer such as a chlorinated rubber, a styrene-butadiene block copolymer, a polyurethane or the like and containing an ethylenic unsaturated compound and a photo-polymerization initiator is useful as a printing plate material for flexography due to the characteristics of the elastomer. Many such compositions have been proposed, for example, in U.S. Pat. Nos. 2,948,611, 3,024,180, Japanese Patent Publication No. 51-43374, etc.

Such solid, photosensitive resin plate materials need to be developed with halogenated hydrocarbons and therefore have problems as causing health injury, environmental pollution, etc. Therefore, the development of solid, photosensitive resin materials for flexographic printing plates is desired. Various proposals for providing solid, photosensitive resin compositions which are developable with water to give printing plates for flexography have been made, for example, in Japanese Patent Publication No. 62-42259, Japanese Patent Laid-Open Application Nos. 61-22339, 63-186232, 5-160451.

However, it is hard for the materials proposed in these to wholly satisfy the raw plate strength and the water developability of printing plate precursors, the flexibility suitable for flexographic printing plates and even the compatibility with aqueous ink which is essentially used in flexography. Therefore, those which are satisfactory for practical use have not yet been obtained. In particular, solid, photosensitive resin materials for flexographic printing plates which can be developed substantially with only neutral water by practical development have not heretofore been obtained.

The present invention has been made in consideration of various drawbacks in such prior art techniques, and its object is to provide photosensitive resin compositions for flexographic printing plates which have high-degree image reproducibility and flexibility suitable for flexography and which have good water developability and good compatibility with aqueous ink.

DESCRIPTION OF THE INVENTION

One photosensitive resin composition for printing plates of the present invention, which is to attain the above-mentioned object, is a photosensitive resin composition for printing plates, comprising the following components A, B-1, C and D:

A: a hydrophilic polymer

B-1: a rubber having a molecular weight of 40,000 or more

C: a photo-polymerizing unsaturated compound having ethylenic double bond(s) in the molecule D: a photo-polymerization initiator.

Another photosensitive resin composition for printing plates of the present invention is a photosensitive resin composition for printing plates, comprising the following components A, B-2, C and D:

A: a hydrophilic polymer

B-2: a dynamically-vulcanized rubber

C: a photo-polymerizing unsaturated compound having ethylenic double bond(s) in the molecule D: a photo-polymerization initiator.

BEST MODES OF CARRYING OUT THE INVENTION

The term "hydrophilic" which characterizes the component A of the present invention means the property of a polymer of dissolving and/or dispersing in water. For example, the hydrophilic polymer as referred to herein is such that, when a film of the polymer is dipped in water or hot water and rubbed with a brush or the like, all or a part of the polymer dissolves out into the water or the polymer is swollen, broken and dispersed in the water, by which the weight of the film is reduced or the film itself is disintegrated. In view of the object of the present invention, preferably used is a hydrophilic polymer, the 0.5 mm-thick film of which is, when dipped in water at 25° C. for one hour, dissolved or, even if not, it absorbs 200% or more, relative to the polymer, of water to be swollen.

As examples of such a hydrophilic polymer, mentioned are polymers soluble in alcohols and/or water, which include polyamides, partially-saponified polyvinyl acetates, celluloses, etc. In view of the miscibility of the hydrophilic polymer with the component B-1 or B-2 and also with the photo-polymerizable unsaturated compound and of the printing durability of the printing plate to be obtained, polyamides are preferably used in the present invention.

According to the present invention, photosensitive resin compositions have been found which can be developed with neutral water due to the peculiar properties of the hydrophilic polymer of the component A and which can be applied to printing with aqueous ink.

The hydrophilic polyamide which is used in the present invention as the component A is preferably any one of polyamides having sulfonic acid groups or sulfonato groups at the side chains, polyamides having ether bonds in the molecule, polyamides having piperidine skeletons, and polyamides having amino groups at the side chains.

As examples of polyamides having sulfonic acid groups or sulfonato groups at the side chains, mentioned are polyamides having sulfonic acid groups or sulfonato groups, such as those described in Japanese Patent Laid-Open No. 48-72250, which are obtained by copolymerizing sodium 3,5-dicarboxybenzene-sulfonate or the like and ordinary raw materials for polyamides such as lactams, aminocarboxylic acids, diamines and dicarboxylic acids. As examples of polyamides having ether bonds in the molecule, mentioned are polyamides to be obtained by copolymerizing at least any one of dicarboxylic acids, diamines, aminocarboxylic acids and lactams having ether bond(s) in the molecule; and copolymerized polyamides having polyalkylene ether segments such as those proposed in Japanese Patent Laid-Open No. 55-74537. As examples of polyamides having piperizine skeletons, mentioned are polyamides to be obtained by (co)polymerizing N,N'-di(γ-aminopropyl)piperazine optionally along with dicarboxylic acids, diamines, aminocarboxylic acids and lactams, such as those described in Japanese Patent Laid-Open No. 50-7605. As polyamides having amino groups at the side chains, preferred are those having tertiary amino groups at the side chains. As examples of these, mentioned are polyamides to be obtained by ring-cleaving polymerization of α-(N,N'-dialkylamino)-ε-caprolactams; and polyamides to be obtained by copolymerization of α-(N,N'-dialkylamino)-ε-caprolactams with at least any one of diamines, aminocarboxylic acids and lactams. In such polyamides having piperazine skeletons and polyamides having amino groups at the side chains, the nitrogen atom may be quaternized with acrylic acid or the like.

Of these hydrophilic polyamides for the component A, preferably used are polyamides having ether bonds in the molecule, more preferably those having ether bonds in the polyalkylene ether segments. More preferably, the polyalkylene ether segments have a molecular weight of from 150 to 1500. Regarding the concrete structures of the polyamides, structures, preferably used are copolymerized polyamides having terminal amino groups and having from 30 to 70% by weight of constitutive units composed of polyoxyethylene and other polyamide components, for example, composed of aliphatic dicarboxylic acids and diamines, where the polyether segments have a molecular weight of from 150 to 1500.

These hydrophilic polymers for the component A may be used singly or may also be used as mixtures of two or more selected from the above-mentioned various polymers.

It is desirable that the hydrophilic polymer content of the photosensitive resin composition is from 3 to 40% by weight of the composition, more preferably from 5 to 20% by weight of the same. If the content is less than 3% by weight, the developability of the composition is lowered and the morphology retentiveness of the raw plate having the composition is lowered. If, however, it is more than 40% by weight, the water-proofness of the printing plate processed from the raw plate is lowered with the result that the printing plate is easily swollen with aqueous ink and its printing durability is worsened.

The photosensitive resin composition for printing plates of the present invention contains a rubber having a molecular weight of 40,000 or more as the component B-1 or a dynamically-vulcanized rubber as the component B-2, along with the hydrophilic polymer A. The rubber having a molecular weight of 40,000 or more of the component B-1 and the dynamically-vulcanized rubber of the component B-2 will be hereinafter generically referred to as rubber B.

The rubber having a molecular weight of 40,000 or more of the component B-1 for use in the present invention is not specifically defined but may be any rubber except so-called liquid rubbers. The molecular weight of the rubber as referred to herein indicates a number average molecular weight thereof.

The rubber includes raw material rubbers and elastomers, such as high-molecular isoprene rubbers, butadiene rubbers, styrene-butadiene rubbers, chloroprene rubbers, nitrile rubbers, butyl rubbers, acrylic rubbers, epichlorohydrin rubbers, silicone rubbers, etc.; copolymers of dienes, such as styrene-butadiene copolymers, styrene-isoprene copolymers, butadiene-acrylic acid copolymers, etc.; copolymers of olefins, such as ethylene-propylene copolymers, ethylene-vinyl acetate copolymers, etc. Of these, copolymers of dienes and copolymers of olefins are preferably used in view of the aqueous ink resistance of the printing plates to be obtained.

In order to satisfy both the water developability of the printing plate material and the compatibility of the printing plate with aqueous ink, it is desirable that the rubber having a molecular weight of 40,000 or more of the component B-1 is independently dispersed in the photosensitive resin composition of the present invention. To disperse the rubber in the photosensitive resin composition, preferably employed is a method comprising a step of melting and blending the hydrophilic polymer and the rubber to obtain a melt blend of the two. The melt-blending step is generally such that two or more polymers are blended at temperatures not lower than the softening points of the polymers. By the melt-blending, fine rubber particles having small sizes are dispersed in the whole of an open polymer matrix. The melt-blending may be conducted by the use of ordinary mastication devices, for example, Banbury mixers, Brabender mixers, kneaders, double-screw extruders and the like mixers. The temperature for the melt-blending is preferably within the range between 100° C. and 250° C.

The dynamically-vulcanized rubber B-2 which is the other rubber component B for use in the present invention is described hereinunder. "Dynamic vulcanization" is to vulcanize a rubber while blending and kneading the rubber with a matrix of a thermoplastic resin. The "dynamically-vulcanized rubber" is a rubber obtained by such dynamic vulcanization. In order to prepare the dynamically-vulcanized rubber, for example, the hydrophilic polymer A of the present invention is melt-kneaded with a non-vulcanized rubber generally at temperatures not lower than the softening points of these materials thereby vulcanizing the non-vulcanized rubber to obtain a melt blend comprising the hydrophilic polyamide A and the vulcanized rubber. By the melt-blending, fine rubber particles having small sizes are dispersed in the hydrophilic polymer A, and after the vulcanization of the rubber particles, the intended melt blend is obtained. Concretely, the hydrophilic polymer is blended with a non-vulcanized rubber optionally along with a vulcanizing agent, and then the resulting blend is masticated at temperatures sufficient for vulcanization in an ordinary mastication device, for example, a Banbury mixer, a Brabender mixer, a double-screw extruder or the like mixer. The hydrophilic polymer and the raw rubber are blended at temperatures sufficient for softening the hydrophilic polymer, or more generally, when the hydrophilic polymer A is crystalline at ordinary temperature, these are blended at temperatures not lower than melting point of the polymer. After the hydrophilic polymer A and the rubber have been blended densely, a vulcanizing agent is added thereto, if desired. The time for heating and masticating the melt blend at vulcanizing temperatures is generally several minutes or less, within which the intended vulcanization is finished. However, if a shorter time is desired, much higher temperatures may be employed. The temperature range for the vulcanization may be from the melting point of the hydrophilic polymer A to the decomposition point of the rubber, which is preferably between 100° C. and 250° C. The highest temperature somewhat varies, depending on the type of the rubber, the presence of a deterioration inhibitor and the blending time. Typically, the temperature range is between about 130° C. and about 250° C. The preferred range is between about 150° C. and about 230° C. In order to obtain a good blend polymer containing a vulcanized rubber, it is important to continue the blending, without stopping it, until the vulcanization is finished.

The non-vulcanized rubber prior to the dynamic vulcanization thereof is not specifically defined but is preferably a so-called solid rubber having a molecular weight of 40,000 or more. It includes, for example, raw material rubbers and elastomers, such as isoprene rubbers, butadiene rubbers, styrene-butadiene rubbers, chloroprene rubbers, nitrile rubbers, butyl rubbers, acrylic rubbers, epichlorohydrin rubbers, silicone rubbers, etc.; copolymers of dienes, such as styrene-butadiene copolymers, styrene-isoprene copolymers, butadiene-acrylic acid copolymers, etc.; copolymers of olefins, such as ethylene-propylene copolymers, ethylene-vinyl acetate copolymers, etc. Of these, copolymers of dienes and copolymers of olefins are preferably used in view of the aqueous ink resistance of the printing plates to be obtained.

The dynamically-vulcanized rubber to be obtained from the non-vulcanized rubber preferably has a gel content of 50% or more, more preferably 80% or more, after the vulcanization. Characteristically, the higher the degree of vulcanization, the better the printing durability and the image reproducibility of the printing plates to be obtained. The non-vulcanized rubber to be used may be either a self-vulcanizing one or a non-self-vulcanizing one. The non-self-vulcanizing rubber needs the presence of a vulcanizing agent when it is vulcanized to a desired degree at melt-blending temperatures. The self-vulcanizing rubber can be vulcanized to a desired degree at melt-blending temperatures even in the absence of a vulcanizing agent, as so referred to.

The vulcanizing agent component which may be employed in the present invention for the dynamic vulcanization is not specifically defined but may be any vulcanizing agent which is generally used for vulcanization or rubber. For example, employable for the dynamic vulcanization for the present invention are vulcanizing agents applicable to vulcanization of diene rubbers, such as peroxides, azides, quinoids or sulfur vulcanizing agents. In addition to these, also employable are dimethylolphenol compounds and bismaleimide compounds. Combinations of these vulcanizing agents and even compositions containing disulfide vulcanization promoters are also employable. In order to attain the rubber vulcanization, a sufficient amount of the vulcanizing agent is used but an excess amount of the same must not be used. This is because the addition of the vulcanizing agent of an amount which is much larger than the amount necessary for completely vulcanizing rubber will cause the deterioration of the photosensitive resin composition containing the rubber blend mixture, since, for example, even the hydrophilic polymer in the mixture is vulcanized with the result that the property of the photosensitive resin composition of dissolving or dispersing in water is worsened while the printing plate material comprising the composition is developed.

In order to satisfy both the water developability of the printing plate material and the compatibility of the printing plate with aqueous ink, it is desirable, though not necessary, that the dynamically-vulcanized rubber B-1 is independently dispersed in the photosensitive resin composition of the present invention. In order to attain this condition, it is advantageous to employ the dynamically-vulcanized rubber that is obtained by utilizing the above-mentioned step of dynamic vulcanization.

In the photosensitive resin composition comprising the rubber B-1 having a molecular weight of 40,000 or more, the ratio of the hydrophilic polymer A to the rubber of the component B-1 is from 1:9 to 8:2, more preferably from 1:9 to 5:5, by weight. If the rubber content of the composition is too small, there occurs a problem in that the flexographic printing plate comprising the composition, of which the provision is the object of the present invention, has poor flexibility. On the other hand, however, if it is too large, there occurs another problem in that the developability of the composition with neutral water is poor.

In the photosensitive resin composition comprising the rubber B-1 having a molecular weight of 40,000 or more, it is desirable that the amount of the B-1 component is from 10 to 80% by weight of the composition, more desirably from 30 to 70% by weight of the same. In addition to the rubber that is incorporated into the composition as the melt mixture containing it, fine rubber particles of a rubber emulsion, rubber latex or the like may further be added to the photosensitive resin composition during the preparation of the composition. If the amount of the rubber is less than 10% by weight, the flexibility of the printing plate to be formed is lowered. However, if it is more than 80% by weight, the developability of the composition is lowered.

In the photosensitive resin composition for printing plates comprising the component B-1, it is desirable that the total amount of the hydrophilic polymer of the component A and the rubber of the component B-1 is from 20 to 90% by weight of the composition, more preferably from 50 to 80% by weight of the same. If the total amount in question is less than 20% by weight, the stickiness of the surface of the printing plate to be obtained is too large, or the morphology retentiveness of the raw plate comprising the photosensitive resin composition is worsened. However, if it is more than 90% by weight, the photosensitive characteristics, especially the image reproducibility of the raw plate are worsened.

In the photosensitive resin composition for printing plates comprising the component B-2, the ratio of the hydrophilic polymer A to the dynamically-vulcanized rubber B-2 is preferably from 1:9 to 8:2, more preferably from 1:9 to 5:5, by weight. If the rubber content of the composition is too small, there occurs a problem in that the flexographic printing plate comprising the composition, of which the provision is the object of the present invention, has poor flexibility. On the other hand, however, if it is too large, there occurs another problem in that the developability of the composition with neutral water is poor.

In the photosensitive resin composition for printing plates comprising the component B-2, it is desirable that the amount of the dynamically-vulcanized rubber B-2 is from 10 to 80% by weight of the composition, more desirably from 30 to 70% by weight of the same. If the amount of the rubber is less than 10% by weight, the flexibility of the printing plate to be formed is lowered. However, if it is more than 80% by weight, the developability of the composition is lowered.

In the resin composition for printing plates comprising the component B-2, it is desirable that the total amount of the hydrophilic polymer A and the dynamically-vulcanized rubber B-2 is from 20 to 90% by weight of the composition, more preferably from 50 to 80% by weight of the same. If the total amount in question is less than 20% by weight, the stickiness of the surface of the printing plate to be obtained is too large, or the morphology retentiveness of the plate is worsened. However, if it is more than 90% by weight, the photosensitive characteristics, especially the image reproducibility of the plate are worsened.

The photo-polymerizing unsaturated compound having ethylenic double bond(s) in the molecule, which is the component C of the present invention, has the property of being polymerized by addition polymerization. As the compound, any known one can be used. However, preferred are those which are miscible in a certain degree or more with the hydrophilic polymer A.

Concretely mentioned are the following: Monoacrylates and monomethacrylates having hydroxyl group(s), such as 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, 3-chloro-2-hydroxypropyl acrylate, 3-chloro-2-hydroxypropyl methacrylate, etc.; polyacrylates and polymethacrylates to be obtained by the reaction of polyalcohols, such as ethylene glycol, and unsaturated carboxylic acids, such as acrylic acid or methacrylic acid, etc.; unsaturated epoxy compounds, such as glycidyl acrylate, glycidyl methacrylate, 3,4-epoxycyclohexyl acrylate, 3,4- epoxycyclohexyl methacrylate, etc.; polyacrylates and polymethacrylates having hydroxyl group(s) to be produced by the reaction of polyglycidyl ethers, such as ethylene glycol diglycidyl ether, and unsaturated carboxylic acids, such as acrylic acid or methacrylic acid, etc.; polyacrylates and polymethacrylates having hydroxyl group(s) to be produced by the reaction of unsaturated epoxy compounds, such as glycidyl methacrylate, and unsaturated carboxylic acids, such as acrylic acid or methacrylic acid, etc.; as well as acrylamide-type photo-polymerizing monomers, such as polyacrylamides and polymethacylamides to be obtained by the condensation of acrylamide, methacrylamide, N-methylolacrylamide, N-methylolmethacrylamide, diacetoneacrylamide, methylenebisacrylamide, N-methylolacrylamide or N-methylolmethacrylamide and polyalcohols. Preferably used are acrylates and methacrylates having hydroxyl group(s), and acrylamides and methacrylamides.

The proportion of the photo-polymerizing unsaturated compound C in the photosensitive resin composition is preferably from 10 to 80% by weight of the composition, more preferably from 10 to 60% by weight of the same. If the proportion of the photo-polymerizing unsaturated compound in the photosensitive resin composition is less than 10% by weight, the composition is easily swollen with a dilution solvent to be in aqueous ink consisting essentially of water, since the density of the crosslinked structure to be formed by photo-polymerization in the composition is insufficient. The result is that the solid area of the printing plate to be obtained is swollen and broken during printing to often cause printing failure. In addition, since the crosslinked density could not reach a sufficient level even by exposure, the desired image reproducibility could not be obtained.

On the contrary, if the proportion of the photo-polymerizing unsaturated compound C in the photosensitive resin composition is more than 80% by weight, the relief formed on the processed plate is extremely brittle, since the density of the crosslinked structure formed by photo-polymerization is too large, with the result that there occurs a problem in that the relief is cracked during printing.

The photo-polymerization initiator, which is the component D of the present invention, is one with which the polymerization of the photo-polymerizing unsaturated compound having ethylenic double bond(s) in the molecule, which is the component C, is initiated when visible rays, ultraviolet rays or electromagnetic waves are applied thereto. In general, the initiator is a radical generator, including, for example, benzoin alkyl ethers, benzophenones, anthraquinones, benzils, acetophenones, diacetyls, etc. The photo-polymerization initiator is in the photosensitive resin composition in an amount of from 0.01 to 10% by weight of the composition.

It is possible to add to the photosensitive resin composition of the present invention, as dissolution aids for the hydrophilic polymer and the photo-polymerizing unsaturated compound, polyalcohols such as ethylene glycol, diethylene glycol, triethylene glycol, glycerin, trimethylolpropane, trimethylolethane, etc., or even N-ethyl-p-toluenesulfonamide, N-butylbenzenesulfonamide, N-methylbenzenesulfonamide, etc. These polyalcohols and sulfonamide compounds are noted to have effects of further improving the flexibility of the part of the composition that has been cured by photo-polymerization and of preventing the relief formed from being cracked. Such polyalcohols and sulfonamide compounds can be added to the photosensitive resin composition in an amount of 30% by weight or less of the composition.

Known conventional polymerization inhibitors can be used for the purpose of improving the heat stability of the photosensitive resin composition of the present invention during its preparation or storage. As preferred thermal polymerization inhibitors, mentioned are phenols, hydroquinones, catechols, etc. These thermal polymerization inhibitors can be added to the composition in an amount of from 0.001 to 5% by weight of the composition. In addition to these additive, it is also possible to add dyes, pigments, surfactants, defoaming agents, ultraviolet absorbents, fragrances, etc. to the composition of the present invention.

As a method for producing the photosensitive resin composition of the present invention, preferably employed is the method mentioned hereinunder. First, a melt blend comprising the hydrophilic polymer of the component A and the rubber of the component B is prepared, as so mentioned above. The other components C and D are further blended with the resulting melt blend to obtain the intended photosensitive resin composition of the present invention. The components C and D may be added at the same time or either one of them may be added prior to the other.

The method of blending the melt blend and the other components comprises, for example, a step of dissolving the melt blend comprising the hydrophilic polymer and the rubber in a mixed solvent of water/alcohol or the like under heat. In this step, a part or all of the hydrophilic polymer is dissolved in the solvent while the rubber is dispersed therein as micro-particles. If desired, an unsaturated epoxy compound is added to the resulting solution and is reacted with the polymer by addition reaction. Further, the photo-polymerizing unsaturated compound and the photo-polymerization initiator and optionally a heat stabilizer are added to the solution and fully blended by stirring to obtain a solution comprising a photosensitive resin composition for printing plates.

If an unsaturated epoxy compound is added to the solution comprising the melt mixture of the hydrophilic polymer A and the rubber B to thereby add the unsaturated epoxy compound to the terminal carboxyl groups of the hydrophilic polymer and the rubber, the polymer and the rubber themselves become photo-polymerizable. As a result, the network structure of the relief to be formed by the photo-polymerization of such photo-polymerizable polymer and rubber with the photo-polymerizable compound is to have a higher density, and the relief thus formed is to have improved water-proofness and high-degree image reproducibility. In addition, since the relief is tough, it is free from the problem of cracking during printing.

The above-mentioned solution of the photosensitive resin composition for printing plates is coated on a support to form a photosensitive layer thereon. A photosensitive resin plate material is obtained. To form the photosensitive layer, for example, a majority of the solvent is removed from the solution by distillation and then the solution is heated to be a dense melt, which is extruded onto a support. As another method which can also be employed, a photosensitive sheet is prepared by a dry filming process, and the sheet is attached to a support to provide a photosensitive layer thereon. As still another method, a photosensitive film may be directly formed on a support according to a dry filming process, to obtain a photosensitive resin plate material having a photosensitive layer on the support. As the support, employable is a metal plate of, for example, steel, stainless, aluminium, copper or the like, a plastic sheet such as a polyester film or the like, or a synthetic rubber sheet of, for example, a styrene-butadiene copolymer or the like. It is desirable that the photosensitive layer is formed to have a thickness of from 0.01 to 10 mm. In the manner mentioned above, the photosensitive resin composition of the present invention is coated on a support to obtain a photosensitive resin plate material.

To produce a printing plate from the photosensitive resin plate material of the present invention, a film of a negative or positive original is airtightly attached to the photosensitive layer that has been formed in the manner mentioned above, and light generally having a wavelength of from 300 to 400 mμ is irradiated thereto from a high-pressure mercury lamp, an ultra-high-pressure mercury lamp, a metal halide lamp, a xenon lamp, a carbon arc lamp, a chemical lamp or the like, for pattern exposure. The exposed area is made insoluble due to the photo-polymerization. Next, the thus-exposed layer is developed with neutral water, using a spray developing device or a brush developing device, whereby the non-polymerized area is dissolved out into the water. In this manner, a relief is formed on the support. After drying, a printing plate is obtained and this is used for printing. The printing plate of the present invention having a Shore A hardness (according to ASTM D2240) of from 40 to 75 is favorably used as a flexographic printing plate.

The printing plate thus formed may be further treated with active rays in air or in vacuum by which the photo-polymerization of the relief part is promoted, prior to using it for actual printing.

The photosensitive resin compositions of the present invention have high-degree image reproducibility and flexibility effective as those for flexographic printing plates. In addition, they have good water developability and satisfactory compatibility with aqueous ink.

Such characteristic advantages have been derived from the following aspects. As containing a hydrophilic polymer and a rubber, the photosensitive resin compositions themselves can be developed with water. In addition, since the rubber in the compositions is insoluble in water, the flexibility of the printing plate is improved and resistance thereof to aqueous ink comprising a resin dissolved in a solvent consisting essentially of water is improved noticeably.

EXAMPLES

The present invention is described in detail hereinunder by means of examples.

The parts as referred to in the following examples are by weight. Unless otherwise specifically indicated, the number average molecular weights referred to therein are values as obtained by the combination of viscometry and GPC. To obtain the relative viscosity [ηr] of the polymer referred to hereinunder, the polymer was dissolved in 98% sulfuric acid at a ratio of 1 g/100 ml and the viscosity of the resulting solution was measured at 25° C.

Examples of producing the hydrophilic polymers used in the following examples are described.

Production Examples
A-1 <Production of Polyamide Having Ether Bonds>

From ε-caprolactam/equimolar salt of hexamethylenediamine and adipic acid/equimolar salt of α,ω-diaminopropylpolyoxyethylene (with a number average molecular weight of 1000) and adipic acid (20/20/60, by weight), obtained was a copolymerized polyamide.

The determination of the terminal groups of the copolymerized polyamide obtained hereinabove revealed that the polyamide had a primary amino group content of $4.0 \times 10^{-5}$ mols/g, a carboxyl group content of $2.1 \times 10^{-5}$ mols/g, and a number average molecular weight (measured by a terminal group determination method) of about 33,000. The property of this polymer was such that it dissolves in water at 25° C.

A-2 <Production of Polyamide Having Sulfonic Acid Groups at the Side Chains>

113 g of ε-caprolactam, 17.6 g of hexamethylenediamine and 66 g of α-aminocaproic acid were fed into an autoclave and, after substitution by nitrogen, the contents were reacted at 230° C. for 3 hours. After having been cooled, 244 g of 3-hydroxy-butanesulfonic acid lactone and 13.8 g of potassium sulfate were added to the reaction mixture. After having been again substituted by nitrogen, these were reacted at 230° C. for one hour to obtain a copolymerized polyamide. The property of this polymer was such that it dissolves in water at 25° C.

A-3 <Production of Polyamide Having Piperazine Skeletons>

50 parts of N,N'-di(γ-aminopropyl)piperazine adipate, 30 parts of ε-caprolactam and 20 parts of water were fed into an autoclave and, after substitution by nitrogen, the autoclave was airtightly sealed and gradually heated. After the inner pressure reached 10 kg/cm$^2$, water was removed by distillation until the pressure could no more be maintained, whereby the pressure was restored to ordinary pressure within about 2 hours. After this, the compounds were reacted for one hour at ordinary pressure. The highest polymerization temperature was 255° C. The polymer thus obtained was a transparent, pale yellow polyamide having a softening point of from 90 to 105° C. and [ηr] of 2.3. The property of this polymer was such that it dissolves in water at 25° C.

A-4 <Production of Polyamide Having Amino Groups at the Side Chains>

90 parts of α-dimethyl-ε-caprolactam and 10 parts of water were fed into an autoclave and, after substitution by nitrogen, the autoclave was airtightly sealed and gradually heated. After the inner pressure reached 3.5 kg/cm$^2$, water was removed by distillation until the pressure could no more be maintained, whereby the pressure was restored to ordinary pressure within about 2 hours. After this, the compounds were reacted for 2 hours at ordinary pressure. The highest polymerization temperature was 260° C. The polymer thus obtained had [ηr] of 2.5. The property of this polymer was such that it dissolves in water at 25° C.

Example 1

20 parts of the copolymerized polyamide as obtained in Production Example A-1 and 80 parts of a carboxyl group-modified nitrile-butadiene rubber (Nipol 1072 ex Nippon Zeon Co., having a number average molecular weight of 500000) were blended, using a closed mixer being driven at 180° C., to obtain a melt blend.

The morphology of the melt blend was observed, using a scanning electronic microscope (JSM-T300 Model ex Nippon Electronics Co.; the condition for the observation was to form a reflected electronic composition image). As a result of the observation, it was confirmed that the melt blend has a sea-island dispersion structure where the sea is composed of the polymer A-1 and the island is composed of the carboxylated nitrile-butadiene rubber and that the diameter of each island part is within the range of from 0.5 to 4 microns.

60 parts of the melt blend was dissolved in 160 parts by weight of a mixed solvent of ethanol/water (=60/40, by weight) under heat at 90° C.

Next, 2 parts by weight of glycidyl methacrylate was added thereto and reacted for one hour at 80° C., whereby the epoxy group in the glycidyl methacrylate was reacted with the amino group and the carboxyl group existing at the terminals of the polyamide to thereby introduce methacryloyl groups into the terminals of the polyamide. Next, 30 parts by weight of a photo-polymerizing unsaturated compound of β-hydroxyethyl-β'-acryloyloxyethyl phthalate was added thereto. Then, 2 parts by weight of a photo-polymerization initiator of dimethylbenzylketal, 0.1 part by weight of a thermal polymerization inhibitor of hydroquinone monomethyl ether and 6 parts by weight of sodium methylenebisnaphthalenesulfonate were added thereto and fully blended by stirring.

The thus-obtained solution comprising a photosensitive resin composition was spread and coated on a 100 μm-thick polyester substrate that had been previously coated with a polyester adhesive and cured, and the thus-coated substrate was left at room temperature to form thereon a photosensitive layer having a thickness of 1700 μm. In this manner, a solid photosensitive resin-coated raw plate was obtained, having a compression strength of 4 kg/cm$^2$.

The morphology of the raw plate was observed, using a scanning electronic microscope (JSM-T300 Model ex Nippon Electronics Co.; the condition for the observation was to form a reflected electronic composition image). As a result of the observation, it was confirmed that the resin coat had a sea-island dispersion structure where the sea was composed of the polymer A-1 and the photo-polymerizing unsaturated compound and the island was composed of the carboxylated nitrile-butadiene rubber and that the diameter of each island part was within the range of from 0.5 to 4 microns.

A gray-scale negative film for sensitometry (21 Steps Sensitivity Guide, ex Stouffer Co.) and a negative film for evaluation of image reproducibility (150 lines, 3%, 5%, 10% dots; having 200 μm-diameter and 300 μm-diameter independent dots, and 50 μm-wide and 70 μm-wide fine lines) were airtightly attached to the photosensitive layer of the raw plate in a vacuum, and the plate was exposed in an exposure device having fifteen 20 W-chemical lamps arranged in parallel at a distance of 15 cm from the light source for 10 minutes.

After exposure, the plate was developed, using a brushing machine containing neutral water at 35° C. therein. After developing for 5 minutes, a 750 μm-thick relief image was formed. Thus, a printing plate was obtained. As a result of the examination of the relief image, it was found that up to 16 steps remained in the gray scale area and that 5% dots, 300 μm-independent dots and 50 μm-fine lines were almost completely reproduced in the image area. The plate was then post-exposed to active rays by which the photosensitive layer was completely photo-cured. After this, the relief had a Shore A hardness of 60. Using this printing plate, a flexographic printing test using aqueous ink was carried out to obtain 100000 prints. All these prints were good.

Comparative Example 1

A photosensitive resin printing plate was obtained in the same manner as in Example 1, except that the melt blend of the polymer A-1 and the carboxylated nitrile-butadiene rubber "Nipol 1072" was not used but only 60 parts of the polymer A-1 was used. The printing plate had a Shore A hardness of 90 and was hard if desired to be used for flexography. Using this printing plate, a flexographic printing test was carried to obtain 20000 prints. After the test, the relief on the plate was partly scratched off.

Comparative Example 2

A photosensitive resin printing plate was obtained in the same manner as in Example 1, except that the rubber component in the melt blend was replaced by a liquid polybutadiene rubber (M2000-20 ex Nippon Petro-Chemical Co.; having a number average molecular weight of 2000). However, the raw plate had no morphology retentiveness. The printing plate obtained after exposure had a Shore A hardness of 40 and was extremely soft. However, this had problems in that it was not elastic and, even after exposure, it was still sticky and stained negative films.

Example 2

In the same manner as in Example 1 except that the polymer A-2 was used in place of the polymer A-1 to obtain the melt blend, a printing plate having a relief image thereon was obtained via the production of a solution of a photosensitive resin composition and the production of a photosensitive resin-coated raw plate. After post-exposure to active rays, the printing plate had a Shore A hardness of 68. Using this printing plate, a flexographic printing test using aqueous ink was carried out to obtain 100000 prints. All these prints were good.

Example 3

In the same manner as in Example 1 except that the polymer A-3 was used in place of the polymer A-1 to obtain the melt blend, a printing plate having a relief image thereon was obtained via the production of a solution of a photosensitive resin composition and the production of a photosensitive resin-coated raw plate. After post-exposure to active rays, the printing plate had a Shore A hardness of 62. Using this printing plate, a flexographic printing test using aqueous ink was carried out to obtain 100000 prints. All these prints were good.

Example 4

In the same manner as in Example 1 except that the polymer A-4 was used in place of the polymer A-1 to obtain the melt blend, a printing plate having a relief image thereon was obtained via the production of a solution of a photosensitive resin composition and the production of a photosensitive resin-coated raw plate. After post-exposure to active rays, the printing plate had a Shore A hardness of 73. Using this printing plate, a flexographic printing test using aqueous ink was carried out to obtain 100000 prints. All these prints were good.

Example 5

In the same manner as in Example 1 except that an ethylene-propylene rubber (JSR EP33 ex Nippon Synthetic Rubber Co.; having a number average molecular weight of 70000) was used as the rubber component to obtain the melt blend, a printing plate having a relief image thereon was obtained via the production of a solution of a photosensitive resin composition and the production of a photosensitive resin-coated raw plate. After post-exposure to active rays, the printing plate had a Shore A hardness of 70. Using this printing plate, a flexographic printing test using aqueous ink was carried out to obtain 100000 prints. All these prints were good.

Example 6

In the same manner as in Example 1 except that a styrene-butadiene rubber (Nipol 1507 ex Nippon Zeon Co.;

having a number average molecular weight of 800000) was used as the rubber component to obtain the melt blend, a printing plate having a relief image thereon was obtained via the production of a solution of a photosensitive resin composition and the production of a photosensitive resin-coated raw plate. After post-exposure to active rays, the printing plate had a Shore A hardness of 63. Using this printing plate, a flexographic printing test using aqueous ink was carried out to obtain 150000 prints. All these prints were good.

Example 7

In the same manner as in Example 1 except that a nitrile-butadiene rubber (N230S ex Nippon Synthetic Rubber Co.; having a number average molecular weight of 60000) was used as the rubber component to obtain the melt blend, a printing plate having a relief image thereon was obtained via the production of a solution of a photosensitive resin composition and the production of a photosensitive resin-coated raw plate. After post-exposure to active rays, the printing plate had a Shore A hardness of 65. Using this printing plate, a flexographic printing test using aqueous ink was carried out to obtain 120000 prints. All these prints were good.

Example 8

30 parts of the copolymerized polyamide as obtained in Production Example A-1 and 70 parts of a carboxylated nitrile-butadiene rubber (Nipol 1072 ex Nippon Zeon Co., having a number average molecular weight of 500000) were blended, using a closed mixer being driven at 180° C., to obtain a melt blend. 40 parts of the melt blend and 32 parts, in terms of the solid content, of a synthetic rubber latex (Laxter DM801 ex Dai-Nippon Ink Chemicals Co.; having a non-volatile content of 50%) were dissolved in 100 parts by weight of a mixed solvent of ethanol/water (=90/10, by weight) under heat at 80° C.

Next, 2 parts by weight of glycidyl methacrylate was added thereto and reacted for one hour at 70° C., whereby the epoxy group in the glycidyl methacrylate was reacted with the amino group and the carboxyl group existing at the terminals of the polyamide to thereby introduce methacryloyl groups into the terminals of the polyamide. Next, 30 parts by weight of a photo-polymerizing unsaturated compound of β-hydroxyethyl-β'-acryloyloxyethyl phthalate was added thereto. Then, 2 parts by weight of a photo-polymerization initiator of dimethylbenzylketal, 0.1 part by weight of a thermal polymerization inhibitor of hydroquinone monomethyl ether and 6 parts by weight of sodium methylenebisnaphthalenesulfonate were added thereto and fully blended by stirring.

The thus-obtained solution was spread and coated on a 100 μm-thick polyester substrate that had been previously coated with a polyester adhesive and cured, and the thus-coated substrate was left at room temperature to form thereon a photosensitive layer having a thickness of 2000 μm. In this manner, a solid photosensitive resin-coated raw plate was obtained.

The raw plate was exposed and developed in the same manner as in Example 1 to form a relief image thereon. The plate was then post-exposed to active rays. After this, the printing plate had a Shore A hardness of 58. Using this printing plate, a flexographic printing test using aqueous ink was carried out to obtain 180000 prints. All these prints were good.

Example 9

30 parts of the copolymerized polyamide as obtained in Production Example A-1 and 70 parts of a carboxylated nitrile-butadiene rubber (Nipol 1072 ex Nippon Zeon Co., having a number average molecular weight of 500000) were blended, using a closed mixer being driven at 180° C., to obtain a melt blend. 40 parts of the melt blend, 32 parts, in terms of the solid content, of a synthetic rubber latex (Laxter DM801 ex Dai-Nippon Ink Chemicals Co.; having a non-volatile content of 50%) and 5 parts by weight of a plasticizer of sodium methylenebisnaphthalenesulfonate were further kneaded at 160° C. for 3 minutes in the closed mixer. Next, 30 parts by weight of a polymerizing unsaturated compound of phenoxypolyethylene glycol acrylate was added thereto, and 2 parts by weight of a photo-polymerization initiator of dimethylbenzylketal was added thereto. These were kneaded at 140° C. for 10 minutes. Using a pressing machine heated at 130° C., the thus-obtained photosensitive resin composition was sandwiched between a 100 μm-thick polyester substrate that had been previously coated with a polyester adhesive and cured, and a polyester cover film previously coated with a polyvinyl alcohol, in such a manner that the photosensitive layer to be formed might have a thickness of 1700 μm. In this manner, a raw printing plate was obtained. The raw plate was exposed and developed in the same manner as in Example 1 to obtain a printing plate. This was then post-exposed to active rays. After this, the printing plate had a Shore A hardness of 58. Using this printing plate, a flexographic printing test using aqueous ink was carried out to obtain 130000 prints. All these prints were good. After the test, the surface of the printing plate was not changed at all.

Comparative Example 3

A melt blend with rubber was obtained in the same manner as in Example 1, except that a half-maleate-modified isoprene polymer of LIR-410 (ex Kuraray Co.; having a molecular weight of 25000 and a acid value of 21) was used in place of the polymer A-1 in Example 1. The melt blend was dissolved and dispersed in the same mixed solvent as that in Example 1, and the same additives as those in Example 1 were added thereto. Thus, a solution of a photosensitive resin composition was obtained. Using this, a photosensitive, raw printing plate was obtained in the same manner as in Example 1. Then, this was exposed and developed also in the same manner as in Example 1 to obtain a printing plate. However, the developing speed of the raw plate was lower than that of the raw plate in Example 1. In addition, the image formed did not reproduce 5% dots. Using the thus-obtained printing plate, a flexographic printing test was carried out to obtain 5000 prints. After the test, the relief was seen to be cracked.

Example 10 (Use of Dynamically-Vulcanized Rubber B-2)

Using a closed mixer being driven at 180° C., 20 parts of the copolymerized polyamide as obtained in Production Example A-1 and 80 parts of a carboxylated nitrile-butadiene (Nipol 1072 ex Nippon Zeon Co.; having a number average molecular weight of 50000) were melted and blended for 10 minutes. Then, 0.2 parts of a vulcanizing agent of m-phenylenebismaleimide was added to the resulting melt blend, which was thus dynamically vulcanized. The total blending time was 15 minutes. The morphology of the melt blend was observed, using a scanning electronic microscope (JSM-T300 Model ex Nippon Electronics Co.; the condition for the observation was to form a reflected electronic composition image). As a result of the observation, it was confirmed that the melt blend has a sea-island dispersion structure where the sea is composed of the polymer A-1 and the island is composed of the rubber and that the diameter of each island part is within the range of from 0.5 to 4 microns.

Using water, the copolymerized polyamide was removed from this melt blend. Then, this was dipped in toluene for 24 hours, whereupon the degree of swelling of the rubber with toluene was 150% by weight. If not having been vulcanized, the rubber would have been dissolved in toluene. Therefore, this result verified that the dynamic vulcanization of the rubber in the melt blend.

60 parts of the melt blend obtained above was dissolved in 160 parts by weight of a mixed solvent of ethanol/water (=60/40, by weight) under heat at 90° C.

Next, 2 parts by weight of glycidyl methacrylate was added thereto and reacted for one hour at 80° C., whereby the epoxy group in the glycidyl methacrylate was reacted with the amino group and the carboxyl group existing at the terminals of the polyamide to thereby introduce methacryloyl groups into the terminals of the polyamide. Next, 30 parts by weight of a polymerizing unsaturated compound of β-hydroxyethyl-β'-acryloyloxyethyl phthalate was added thereto. Then, 2 parts by weight of a photo-polymerization initiator of dimethylbenzylketal, 0.1 part by weight of a thermal polymerization inhibitor of hydroquinone monomethyl ether and 6 parts by weight of sodium methylenebisnaphthalenesulfonate were added thereto and fully blended by stirring.

The thus-obtained solution comprising a photosensitive resin composition was spread and coated on a 100 µm-thick polyester substrate that had been previously coated with a polyester adhesive and cured, and the thus-coated substrate was left at room temperature to form thereon a photosensitive layer having a thickness of 1700 µm. In this manner, a solid photosensitive resin-coated raw plate was obtained, having a compression strength of 4 kg/cm$^2$.

The morphology of the raw plate was observed, using a scanning electronic microscope (JSM-T300 Model ex Nippon Electronics Co.; the condition for the observation was to form a reflected electronic composition image). As a result of the observation, it was confirmed that the resin coat has a sea-island dispersion structure where the island is composed of the dynamically-vulcanized rubber and that the diameter of each island part is within the range of from 0.5 to 4 microns.

A gray-scale negative film for sensitometry (21 Steps Sensitivity Guide, ex Stouffer Co.) and a negative film for evaluation of image reproducibility (150 lines, 3%, 5%, 10% dots; having 200 µm-diameter and 300 µm-diameter independent dots, and 50 µm-wide and 70 µm-wide fine lines) were airtightly attached to the photosensitive layer of the raw plate in a vacuum, and the plate was exposed in an exposure device having fifteen 20 W-chemical lamps arranged in parallel, at a distance of 15 cm from the light source for 10 minutes.

After the exposure, this was developed, using a brushing machine containing neutral water at 35° C. therein. After developing for 5 minutes, a 750 µm-thick relief image was formed. Thus, a printing plate was obtained. As a result of the examination of the relief image, it was found that up to 16 steps remained in the gray scale area and that 5% dots, 300 µm-independent dots and 50 µm-fine lines were almost completely reproduced in the image area. The plate was then post-exposed to active rays. After this, the relief had a Shore A hardness of 63. Using this printing plate, a flexographic printing test using aqueous ink was carried out to obtain 100000 prints. All these prints were good.

Comparative Example 4

A photosensitive resin printing plate was obtained in the same manner as in Example 10, except that the melt blend of the polymer A-1 and the carboxylated nitrile-butadiene rubber "Nipol 1072" was not used but only 60 parts of the polymer A-1 was used. The printing plate had a Shore A hardness of 91 and was hard if desired to be used for flexography. Using this printing plate, a flexographic printing test was carried to obtain 20000 prints. After the test, the relief on the plate was partly scratched off.

Example 11 (Use of Dynamically-Vulcanized Rubber B-2)

In the same manner as in Example 10 except that the polymer A-2 was used in place of the polymer A-1 to obtain the melt blend, a photosensitive resin composition was obtained and then a printing plate was obtained. After post-exposure to active rays, the printing plate had a Shore A hardness of 70. Using this printing plate, a flexographic printing test using aqueous ink was carried out to obtain 100000 prints. All these prints were good.

Example 12 (Use of Dynamically-Vulcanized Rubber B-2)

In the same manner as in Example 10 except that the polymer A-3 was used in place of the polymer A-1 to obtain the melt blend, a printing plate was obtained via the production of a solution of a photosensitive resin composition and the production of a photosensitive resin-coated raw plate. After post-exposure to active rays, the printing plate had a Shore A hardness of 64. Using this printing plate, a flexographic printing test using aqueous ink was carried out to obtain 100000 prints. All these prints were good.

Example 13 (Use of Dynamically-Vulcanized Rubber B-2)

In the same manner as in Example 1 except that the polymer A-4 was used in place of the polymer A-1 to obtain the melt blend, a printing plate was obtained via the production of a solution of a photosensitive resin composition and the production of a photosensitive resin-coated raw plate. After post-exposure to active rays, the printing plate had a Shore A hardness of 75. Using this printing plate, a flexographic printing test using aqueous ink was carried out to obtain 100000 prints. All these prints were good.

Example 14 (Use of Dynamically-Vulcanized Rubber B-2)

In the same manner as in Example 10 except that an ethylene-propylene rubber (JSR EP33 ex Nippon Synthetic Rubber Co.; having a number average molecular weight of 70000) was used as the rubber component to obtain the melt blend, a printing plate was obtained via the production of a solution of a photosensitive resin composition and the production of a photosensitive resin-coated raw plate. After post-exposure to active rays, the printing plate had a Shore A hardness of 72. Using this printing plate, a flexographic printing test using aqueous ink was carried out to obtain 100000 prints. All these prints were good.

Example 15 (Use of Dynamically-Vulcanized Rubber B-2)

In the same manner as in Example 10 except that a styrene-butadiene rubber (Nipol 1507 ex Nippon Zeon Co.;

having a number average molecular weight of 800000) was used as the rubber component to obtain the melt blend, a printing plate was obtained via the production of a solution of a photosensitive resin composition and the production of a photosensitive resin-coated raw plate. After post-exposure to active rays, the printing plate had a Shore A hardness of 63. Using this printing plate, a flexographic printing test using aqueous ink was carried out to obtain 150000 prints. All these prints were good.

Example 16 (Use of Dynamically-Vulcanized Rubber B-2)

In the same manner as in Example 10 except that a nitrile-butadiene rubber (N230S ex Nippon Synthetic Rubber Co.; having a number average molecular weight of 60000) was used as the rubber component to obtain the melt blend, a printing plate was obtained via the production of a solution of a photosensitive resin composition and the production of a photosensitive resin-coated raw plate. After post-exposure to active rays, the printing plate had a Shore A hardness of 67. Using this printing plate, a flexographic printing test using aqueous ink was carried out to obtain 120000 prints. All these prints were good.

Example 17 (Use of Dynamically-Vulcanized Rubber B-2)

40 parts of the same polymer blend as that prepared in Example 10, 28 parts, in terms of the solid content, of a synthetic rubber latex (Laxter DM801 ex Dai-Nippon Ink Chemicals Co.; having a non-volatile content of 50%) and 5 parts by weight of sodium methylenebisnaphthalenesulfonate were kneaded at 160° C. for 3 minutes in a closed mixer. Then, 30 parts by weight of a polymerizing unsaturated compound of phenoxypolyethylene glycol acrylate and 2 parts by weight of a photo-polymerization initiator of dimethylbenzylketal were added thereto and further kneaded at 140° C. for 10 minutes. Using a pressing machine heated at 130° C., the thus-obtained photosensitive resin composition was sandwiched between a 100 μm-thick polyester substrate that had been previously coated with a polyester adhesive and cured, and a polyester cover film previously coated with a polyvinyl alcohol, in such a manner that the photosensitive layer to be formed might have a thickness of 1700 μm. In this manner, a raw printing plate was obtained. The morphology of the raw plate was observed, using a scanning electronic microscope (JSM-T300 Model ex Nippon Electronics Co.; the condition for the observation was to form a reflected electronic composition image). As a result of the observation, it was confirmed that the resin coat has a sea-island dispersion structure where the sea is composed of the polymer A-1 and the photo-polymerizing unsaturated compound and the island is composed of the vulcanized rubber and that the diameter of each spherical island part is within the range of from 0.5 to 4 microns. The thus-obtained raw plate was exposed and developed in the same manner as in Example 10 to obtain a printing plate. This was then post-exposed to active rays. After this, the printing plate had a Shore A hardness of 58. Using this printing plate, a flexographic printing test using aqueous ink was carried out to obtain 150000 prints. All these prints were good. After the test, the surface of the printing plate was not changed at all.

Comparative Example 6

A melt blend with rubber was obtained in the same manner as in Example 10, except that a half-maleate-modified isoprene polymer of LIR-410 (ex Kuraray Co.; having a molecular weight of 25000 and an acid value of 21) was used in place of the polymer A-1 in Example 10. However, since the half-maleate-modified isoprene polymer was also vulcanized, the melt blend obtained was insoluble in solvent and could not be formulated into a photosensitive resin composition.

INDUSTRIAL APPLICABILITY

The photosensitive resin compositions for printing plates of the present invention have high-degree image reproducibility and flexibility suitable for flexography and additionally have good water developability with satisfactory compatibility with aqueous ink. Therefore, using the compositions, flexographic printing plates with excellent printing durability in flexography using aqueous ink or other flexographic printing inks can be produced. Further, using these, water-developable plates for flexography with good rubber elasticity can be produced.

We claim:

1. A method for producing a photosensitive resin composition for printing plates comprising the steps of:

melting and blending at least one hydrophilic polyamide selected from the group consisting of polyamides having sulfonic acid groups or sulfonate groups at the side chains, polyamides having ether bonds in the molecule, polyamides containing piperazine moieties and polyamides having amino groups at the side chains as a component A and a rubber having a molecular weight of 40,000 or more as a component B-1 at from 100° C. to 250° C. to form a melt blend, and then melting and blending a photo-polymerizing unsaturated compound having ethylenic double bond(s) in the molecule as a component C and a photo-polymerization initiator as a component D into the melt blend to form said photosensitive resin composition.

2. The method for producing the photosensitive resin composition for printing plates as claimed in claim 1, wherein the rubber of the component B-1 has been dispersed in the composition after melting and blending.

3. The method for producing the photosensitive resin composition for printing plates as claimed in claim 1, wherein the components are added in the following proportions: the sum of component A and component B-1 is 20 to 89.99% by weight, component C is 10 to 79.99% by weight, and component D is 0.01 to 10% by weight, based on the weight of the photosensitive resin composition.

4. The method for producing the photosensitive resin composition for printing plates as claimed in claim 1, wherein the ratio of the hydrophilic polymer of the component A to the rubber of the component B-1 is from 1:9 to 8:2 by weight.

5. The method for producing the photosensitive resin composition for printing plates as claimed in claim 1, wherein the rubber of the component B-1 is selected from the group consisting of a polymer of dienes and a copolymer of olefins.

6. A method for producing a printing plate, comprising a step of patternwise exposing a photosensitive resin coated plate prepared by coating a photosensitive resin composition for printing plates, comprising the following components A, B-2, C and D:

A: a hydrophilic polymer

B-2: a dynamically-vulcanized rubber

C: a photo-polymerizing unsaturated compound having ethylenic double bond(s) in the molecule D: a photo-polymerization initiator, on a support and a step of dissolving or dispersing said photosensitive resin composition with water after the patternwise exposure.

7. A photosensitive resin composition for printing plates, comprising the following components A, B-2, C and D:

A: a hydrophilic polymer which is at least one polymer selected from the group consisting of polyamides, partially-saponified polyvinyl acetates and celluloses;

B-2: a dynamically-vulcanized rubber;

C: a photo-polymerizing unsaturated compound having ethylenic double bond(s) in the molecule;

D: a photo-polymerization initiator.

8. The photosensitive resin composition for printing plates as claimed in claim 7, wherein the dynamically-vulcanized rubber has been dispersed in the composition.

9. The photosensitive resin composition for printing plates as claimed in claim 7, wherein the dynamically-vulcanized rubber is one produced by melting and blending the hydrophilic polymer and a non-vulcanized rubber followed by vulcanizing the non-vulcanized rubber.

10. The photosensitive resin composition for printing plates as claimed in claim 7, comprising the components at the following proportions: the sum of component A and component B-2 is 20 to 89.99% by weight, component C is 10 to 79.99% by weight, and component D is 0.01 to 10% by weight, based on the weight of the photosensitive resin composition.

11. The photosensitive resin composition for printing plates as claimed in claim 10, wherein the ratio of the hydrophilic polymer of the component A to the dynamically-vulcanized rubber of the component B-2 is from 1:9 to 8:2 by weight.

12. The photosensitive resin composition for printing plates as claimed in claim 7, wherein the dynamically-vulcanized rubber of the component B-2 is a vulcanized product selected from the group consisting of a polymer of dienes and a copolymer of olefins.

13. A photosensitive resin coated plate prepared by coating a photosensitive resin composition for printing plates according to claim 7 on a support.

14. The photosensitive resin coated plate as claimed in claim 13, wherein said photosensitive resin composition dissolves or disperses in water.

15. A method for producing a photosensitive resin composition for printing plates of claim 7, comprising a step of dynamically vulcanizing a non-vulcanized rubber while melting and blending the hydrophilic polymer of the component A and the non-vulcanized rubber to prepare a melt blend comprising the hydrophilic polymer of the component A and the dynamically-vulcanized rubber of the component B-2 followed by blending in components C and D with the resulting melt blend.

16. The method for producing a photosensitive resin composition for printing plates as claimed in claim 15, wherein the melting and blending temperature in the step of preparing the melt blend is within the range between 100° C. and 250° C.

17. A photosensitive resin composition for printing plates as claimed in claim 7, wherein the polyamides are at least one hydrophilic polyamide selected from polyamides having sulfonic acid groups or sulfonic groups at the side chain, polyamides having ether bonds in the molecule, polyamides having piperazine moieties and polyamides having amino groups at the side chains.

* * * * *